United States Patent [19]

Schindlbeck

[11] Patent Number: 4,947,114
[45] Date of Patent: Aug. 7, 1990

[54] METHOD OF MARKING SEMICONDUCTOR CHIPS AND MARKABLE SEMICONDUCTOR CHIP

[75] Inventor: Günter Schindlbeck, München, Fed. Rep. of Germany

[73] Assignee: Siemens Aktiengesellschaft, Berlin and Munich, Fed. Rep. of Germany

[21] Appl. No.: 381,052

[22] Filed: May 24, 1982

[30] Foreign Application Priority Data

Jun. 10, 1981 [DE] Fed. Rep. of Germany ....... 3123031

[51] Int. Cl.$^5$ ....................... G01R 31/00; H01L 23/48
[52] U.S. Cl. .................................... 324/158 R; 357/65
[58] Field of Search ................ 324/158 R; 357/65, 68

[56] References Cited

U.S. PATENT DOCUMENTS 4,219,827  8/1980  Kaiser .................................. 357/68

FOREIGN PATENT DOCUMENTS 3014127  11/1980  Fed. Rep. of Germany .

*Primary Examiner*—Ernest F. Karlsen
*Attorney, Agent, or Firm*—Herbert L. Lerner; Laurence A. Greenberg

[57] ABSTRACT

Method of marking semiconductor chips to indicate at least one definite feature by applying optically recognizable markings to the surface of the semiconductor chips, which includes forming at least one area of the chip provided for marking purposes from a homogeneous and highly reflective material, and applying the optically recognizable markings by changing the surface of the at least one area of the chip provided for making purposes, and a chip which is markable according to the method.

3 Claims, 1 Drawing Sheet

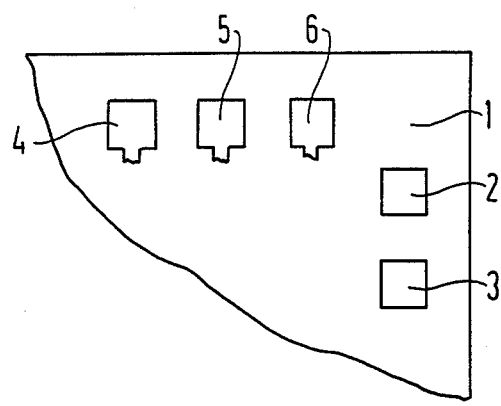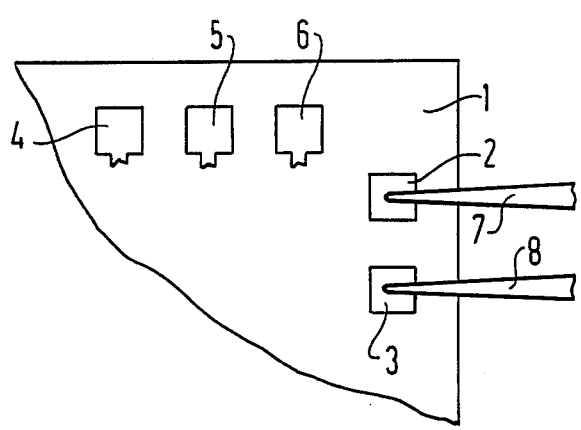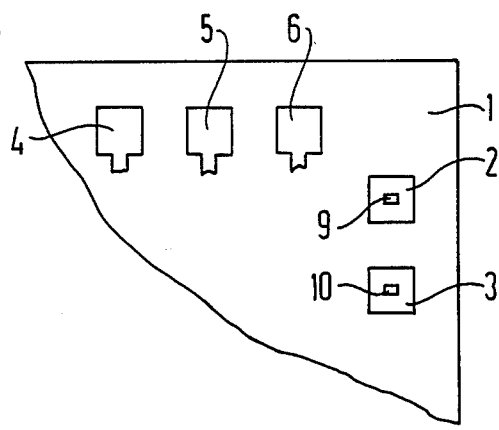

METHOD OF MARKING SEMICONDUCTOR CHIPS AND MARKABLE SEMICONDUCTOR CHIP

The invention relates to a method of marking semiconductor chips to indicate at least one definite feature by means of optically recognizable markings applied to a surface of the semiconductor chip.

Similar methods are used to mark semiconductor chips made in large quantities from a semiconductor wafer. Such chips are tested after the completion of the manufacturing process and marked to reflect the test result, according to given quality features or given applications. For example, it is common practice to test integrated circuits such as semiconductor memories by means of a tester before the semiconductor wafers are cut up, by applying test prods to contact surfaces disposed on the chip surface. It is also common to provide the chips with small ink spots on the chip surface area that contain no contact surfaces, depending on the test result. This process is also called inking. The ink spots may be of different colors so that, for example, an uninked chip can be marked as belonging to grade 1, a chip inked with red ink as belonging to grade 2 and chips inked with blue ink as rejects.

Such multicolor inking methods have the disadvantage that ink on the chip surface, especially in the active area, represents a reliability risk. Ink evaporation may also cause problems when assembling the chip. Furthermore, users of inked systems sometimes have reservations because chips provided with such ink spots can easily be graded as second rate products.

Another marking method provides for a hardware wafer card with a raster in accordance with the chips to be tested on the semiconductor wafer. Individual rasters can be punched out according to the operability of the individual chips so that a topographic picture of the semiconductor wafer is created. In this method, however, the transfer of the hardware wafer card information during the chip assembly is difficult and costly, and in addition there is the danger of mixing up individual wafer cards, and hence the danger of yield losses. Instead of the hardware wafer card it is also possible to record the appropriate information on a software wafer card such as a data tape, and to use this software wafer card to control the assembly. However, the high degree of automation required for this causes high costs, and the risk of mixing up chips or wafers is still not precluded.

It is accordingly an object of the invention to provide a method of marking semiconductor chips and a markable semiconductor chip, which overcomes the hereinafore-mentioned disadvantages of the heretoforeknown methods and devices of this general type, in which the individual chip is unmistakably marked and in which an additional reliability risk and a reduction of the sales value do not occur.

With the foregoing and other objects in view there is provided, in accordance with the invention, a method for marking semiconductor chips to indicate at least one definite feature by applying optically recognizable markings to the surface of the semiconductor chips, which comprises forming at least one area of the chip provided for marking purposes from a homogeneous and highly reflective material, and applying the optically recognizable markings by changing the surface of the at least one area of the chip provided for marking purposes. In this manner, success is achieved in marking the semiconductor chips without applying an additional substance to the chip surface and in designing the markings so that they cannot be recognized by an outsider.

In accordance with another mode of the invention, there is provided a method which comprises providing a metallized surface on the at least one area of the chip provided for marking purposes.

In accordance with a further mode of the invention, there is provided a method which comprises providing a polycrystalline semiconductor material surface on the at least one area of the chip provided for marking purposes.

Metallized surfaces or areas formed of polycrystalline semiconductor material are used because such surfaces are also provided for other purposes in the production of integrated circuits and can, therefore, be produced without noteworthy extra costs.

In accordance with an added mode of the invention, there is provided a method which comprises pressing a prod against the surface of the area of the chip provided for marking purposes to form an optically recognizable mechanical impression. Such prods, e.g. in the form of test prods, are already applied to the contact surfaces provided therefor during the test procedure to produce external connections, so that the method according to the invention can be carried out without additional fixtures.

In accordance with an additional mode of the invention, there is provided a method which comprises irradiating the surface of the area of the chip provided for marking purposes with a laser to form an optically recognizable marking.

In accordance with the device of the invention, there is provided a semiconductor chip to be marked by a method of indicating at least one definite feature by applying optically recognizable markings to the surface of the semiconductor chips, comprising a semiconductor substrate, metallic contact surfaces disposed on the substrate, and at least one metal contact-type surface disposed on the substrate for receiving the optically recognizable markings.

Other features which are considered as characteristic for the invention are set forth in the appended claims.

Although the invention is illustrated and described herein as embodied in a method of marking semiconductor chips and markable semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIGS. 1–3 are enlarged, diagrammatic, fragmentary, top-plan views of the surface of a semiconductor chip during different stages of the process.

Referring now to the figures of the drawing and first particularly to FIG. 1 thereof, it is seen that the enlarged portion of a semiconductor chip 1 shown therein has three metallic contact surfaces 4, 5, 6 which can be contacted by test prods for functional chip testing. The contact surfaces are contacted during the assembly of the chip by a wire which can be connected to the external terminals of the component housing. There are also shown two other contact surfaces 2, 3 which are provided for the execution of the method according to the invention and are not contacted later by a wire. The surfaces 2 to 6 are made of aluminum, for example.

As shown in FIG. 2, after the functioning of the chip has been tested, metallic prods 7 and 8 are mechanically pressed against the surfaces 2 and 3 in accordance with the quality grade determined or in accordance with the desired use.

After the removal of the prods 7 and 8, as shown in FIG. 3, there remain on the surfaces 2 and 3 impressions 9 and 10, respectively, the size of which is chosen in accordance with the size of the ends of the prods 7 and 8, in such a way that the impressions are detectable under a microscope which is used for the assembly of the chips in any event. The quality grades can be coded by means of the two surfaces 2 and 3 provided for marking purposes. For instance, this can be done in such a manner that if no impression appears on the surfaces, this would signify a scrap chip: an impression 9 appearing on the surface 2 but no impression appearing on the surface 3 would signify a chip of quality grade 1; an impression 10 appearing on the surface 3 and no impression appearing on the surface 2 would signify a chip of quality grade 2; and an impression 9, 10 appearing on each of the surfaces 2 and 3, respectively, would represent a chip of quality grade 3. If more than four grades are to be differentiated between, more surfaces intended for marking purposes may be provided.

The prods 7, 8 for marking may be made of beryllium-copper, tungsten carbide or tungsten, in accordance with commonly used test prods, such as is known from German Published, Non-Prosecuted Application DE-OS 30 14 127. Particularly well suited as surfaces provided for marking purposes are aluminum surfaces produced dimensionally and in technological construction to conform to the contact surfaces or pads 4, 5, 6. However, other surfaces formed of a homogeneous and highly reflective material may also be used, e.g. surfaces of polycrystalline semiconductor material.

A marking on surfaces not intended for this purpose from the start should be avoided because this may destroy the passivation of the chips. The prods 7 and 8 used should advantageously have a tip diameter in the range between 10 and 200 $\mu$m, while the surfaces 2, 3 provided for marking purposes may have a width ranging between 50 and 500 $\mu$m. Laser radiation may also be used to provide the markings.

The foregoing is a description corresponding to German Application P 31 23 031.8, dated June 10, 1981, the International priority of which is being claimed for the instant application, and which is hereby made part of this application. Any discrepancies between the foregoing specification and the corresponding German application are to be resolved in favor of the latter.

I claim:

1. Semiconductor chip, comprising a semiconductor substrate having a surface, at least one metal contact-type surface disposed on the surface of the substrate, and optically recognizable markings applied to said at least one metal contact-type surface for indicating at least one definite feature of the chip.

2. Semiconductor chip according to claim 1, wherein said at least one metal contact-type surface is a metallization.

3. Semiconductor chip according to claim 1, wherein said at least one metal contact-type surface is polycrystalline semiconductor material.

* * * * *